United States Patent
Ren et al.

(10) Patent No.: US 11,335,891 B2
(45) Date of Patent: May 17, 2022

(54) IRRADIATION ASSEMBLY, PACKAGING DEVICE AND PACKAGING METHOD

(71) Applicants: BEIJING BOE DISPLAY TECHNOLOGY CO., LTD., Beijing (CN); BOE TECHNOLOGY GROUP CO., LTD., Beijing (CN)

(72) Inventors: Jinyu Ren, Beijing (CN); Yongzhi Song, Beijing (CN); Bo Zhou, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 544 days.

(21) Appl. No.: 16/335,647

(22) PCT Filed: Nov. 5, 2018

(86) PCT No.: PCT/CN2018/113963
§ 371 (c)(1),
(2) Date: Mar. 21, 2019

(87) PCT Pub. No.: WO2019/205563
PCT Pub. Date: Oct. 31, 2019

(65) Prior Publication Data
US 2021/0328200 A1    Oct. 21, 2021

(30) Foreign Application Priority Data
Apr. 24, 2018    (CN) .......................... 201810374256.7

(51) Int. Cl.
*H01L 51/56*    (2006.01)
*H01L 51/52*    (2006.01)
(Continued)

(52) U.S. Cl.
CPC .............. *H01L 51/56* (2013.01); *B32B 37/06* (2013.01); *B32B 37/12* (2013.01);
(Continued)

(58) Field of Classification Search
CPC ... B32B 37/06; B32B 37/12; B32B 2457/206; H01L 21/67115; H01L 21/67126; H01L 51/56; H01L 33/08
See application file for complete search history.

(56) References Cited

U.S. PATENT DOCUMENTS 5,863,327 A * 1/1999 Thakur ................. C23C 16/482
                                                         118/50.1
9,590,206 B2  3/2017 Chen et al.
(Continued)

FOREIGN PATENT DOCUMENTS

CN    104022234 A    9/2014
CN    104505466 A    4/2015
(Continued)

OTHER PUBLICATIONS

Machine translation, Ren, Chinese Pat. Pub. No. CN 108538763A, translation date: Sep. 14, 2021, Espacenet, all pages. (Year: 2021).*
(Continued)

*Primary Examiner* — Victoria K. Hall
(74) *Attorney, Agent, or Firm* — Kinney & Lange, P.A.

(57) ABSTRACT

An irradiation assembly is provided, which is configured to heat and cure a package piece having a first region and a second region, the first region having a first adhesive material therein and the second region having a second adhesive material therein different from the first adhesive material, the irradiation assembly comprising: a light source assembly, configured to emit a first light heating the first adhesive material and to emit a second light curing the second adhesive material; and the package piece is an assembly
(Continued)

configured to encapsulate electronic components accommodated therein, the first region is provided with the electronic components and is filled up with the first adhesive material encapsulating the electronic components, and the second region is arranged at periphery of the first region and is filled with the second adhesive material surrounding the first adhesive material.

19 Claims, 6 Drawing Sheets

(51) Int. Cl.
- *B32B 37/12* (2006.01)
- *B32B 37/06* (2006.01)
- *B32B 37/14* (2006.01)
- *H01L 21/67* (2006.01)

(52) U.S. Cl.
CPC ...... *B32B 37/1207* (2013.01); *B32B 37/1292* (2013.01); *B32B 37/144* (2013.01); *H01L 21/67115* (2013.01); *H01L 21/67126* (2013.01); *H01L 51/524* (2013.01); *H01L 51/5246* (2013.01); *B32B 2037/1253* (2013.01); *B32B 2457/206* (2013.01)

(56) References Cited

U.S. PATENT DOCUMENTS

| | | | | |
|---|---|---|---|---|
| 2011/0002674 | A1* | 1/2011 | Shimizu | H01L 21/67115 392/411 |
| 2011/0304812 | A1 | 12/2011 | Hwang et al. | |
| 2015/0187510 | A1* | 7/2015 | Naito | H01L 51/448 428/76 |
| 2016/0240812 | A1 | 8/2016 | Chen et al. | |
| 2016/0284572 | A1* | 9/2016 | Jeong | H01L 21/67115 |
| 2016/0284942 | A1* | 9/2016 | Gao | H01L 51/56 |
| 2016/0343977 | A1 | 11/2016 | Zeng et al. | |
| 2016/0381732 | A1* | 12/2016 | Moench | C23C 16/46 118/641 |
| 2017/0250369 | A1* | 8/2017 | Kamiya | H01L 51/5246 |
| 2019/0058164 | A1* | 2/2019 | Yu | B32B 37/06 |
| 2019/0103296 | A1* | 4/2019 | Ji | G01J 5/0096 |
| 2020/0044186 | A1* | 2/2020 | Yu | B23K 26/38 |
| 2020/0168836 | A1* | 5/2020 | Yu | H01L 51/5246 |

FOREIGN PATENT DOCUMENTS

| | | | | | |
|---|---|---|---|---|---|
| CN | 105845709 | A | * | 8/2016 | ............. H01L 27/32 |
| CN | 105845709 | A | | 8/2016 | |
| CN | 107591494 | A | * | 1/2018 | ............. H01L 51/52 |
| CN | 107591494 | A | | 1/2018 | |
| CN | 107623085 | A | | 1/2018 | |
| CN | 108365124 | A | | 8/2018 | |
| CN | 108538763 | A | * | 9/2018 | ........ H01L 21/67115 |
| CN | 108538763 | A | | 9/2018 | |

OTHER PUBLICATIONS

Machine translation, Wang, Chinese Pat. Pub. No. CN 105845709A, translation date: Sep. 14, 2021, Espacenet, all pages. (Year: 2021).*
Machine translation, Yu, Chinese Pat. Pub. No. CN 107591494A, translation date: Sep. 14, 2021, Espacenet, all pages. (Year: 2021).*
International Search Report and English Translation of Box V of the Written Opinion dated Feb. 2, 2019, received for corresponding PCT Application No. PCT/CN2018/113963.
First Chinese Office Action dated Jun. 5, 2019, received for corresponding Chinese Application No. 201810374256.7.

* cited by examiner

IRRADIATION ASSEMBLY, PACKAGING DEVICE AND PACKAGING METHOD

This application is a Section 371 National Stage Application of International Application No. PCT/CN2018/113963, filed on Nov. 5, 2018 and entitled "HEATING ASSEMBLY, PACKAGING DEVICE AND PACKAGING METHOD", which has not been published, and which claims priority to Chinese Patent Application Invention No. 201810374256.7 filed on Apr. 24, 2018 in the State Intellectual Property Office of China, the whole disclosure of which is incorporated herein by reference.

BACKGROUND

Embodiments of the present disclosure generally relate to but are not limited to the technical field of display technology, and in particular, to an irradiation assembly configured to irradiate a package piece, a packaging device and a packaging method.

With a development and a mass production of electronic parts and components, packaging technology also develops therewith, and organic electroluminescent displays (generally abbreviated as OLED) are typically packaged by DAM & FILL (i.e., adhesive dam and filling adhesive) packaging technology.

SUMMARY

The embodiments of the present disclosure have been made to overcome or alleviate at least one aspect of the above mentioned disadvantages and/or shortcomings in the prior art, by providing an irradiation assembly, a packaging device and a packaging method.

Following technical solutions are adopted in exemplary embodiments of the invention.

According to one aspect of embodiments of the disclosure, there is provided an irradiation assembly configured to heat and cure a package piece which is aligned with the irradiation assembly and has a first region and a second region, the first region being provided with a first adhesive material therein and the second region being provided with a second adhesive material therein, the second adhesive material being different from the first adhesive material, the irradiation assembly comprising: a light source assembly, which is configured to emit a first light heating the first adhesive material within the first region of the package piece and to emit a second light curing the second adhesive material within the second region of the package piece; the package piece is an assembly configured to encapsulate electronic components accommodated therein, the first region of the package piece is provided with the electronic components and is filled up with the first adhesive material encapsulating the electronic components, and the second region of the package piece is arranged at periphery of the first region and is filled with the second adhesive material surrounding the first adhesive material.

According to an exemplary embodiment of the present disclosure, the light source assembly comprises: a first light-emitting region, which is configured to emit the first light and is arranged corresponding to the first region of the package piece; and a second light-emitting region, which is configured to emit the second light and is arranged corresponding to the second region of the package piece.

According to an exemplary embodiment of the present disclosure, the light source assembly further comprises: a first light source provided in the first light-emitting region and the second light-emitting region respectively and configured to emit the first light; and a light conversion layer provided on a portion of the first light source being located within the second light-emitting region at a side of the first light source facing the package piece, and configured to convert a portion of the first light emitted by the portion of the first light source being located within the second light-emitting region into the second light.

According to an exemplary embodiment of the present disclosure, the light conversion layer is formed by transparent resin doped with an upconversion material.

According to an exemplary embodiment of the present disclosure, the first light source is a visible light source, and the first light is visible light and the second light is ultraviolet light; and the upconversion material is a visible-ultraviolet upconversion material.

According to an exemplary embodiment of the present disclosure, the light source assembly comprises: a first light source provided in the first light-emitting region and configured to emit the first light; and a second light source provided in the second light-emitting region and configured to emit the second light; the first light source and the second light source are disposed to be independent of each other.

According to an exemplary embodiment of the present disclosure, the first light source is a visible light source and the second light source is a ultraviolet light source, and the first light is visible light and the second light is ultraviolet light.

According to an exemplary embodiment of the present disclosure, the irradiation assembly further comprises: supporting columns, which are provided on a side of the light source assembly facing towards the package piece and configured to support the package piece.

According to an exemplary embodiment of the present disclosure, the irradiation assembly further comprises: a diffusion layer covering the light source assembly, or a transparent cover plate covering the light source assembly.

According to an exemplary embodiment of the present disclosure, the irradiation assembly further comprises: a diffusion layer covering the light source assembly, and a transparent cover plate covering the diffusion layer.

According to an exemplary embodiment of the present disclosure, the first light source comprises one or more of the following comprising: area light sources, line light sources, and point light sources.

According to an exemplary embodiment of the present disclosure, the first light source comprises: two area light sources provided individually and independently from each other, or an unitary area light source.

According to an exemplary embodiment of the present disclosure, the first light source comprises: a plurality of point light sources, or a plurality of line light sources, or a combination of a plurality of point light sources and a plurality of line light sources.

According to an exemplary embodiment of the present disclosure, each of the first light source and the second light source comprises one or more of the following comprising: area light sources, line light sources, and point light sources.

According to an exemplary embodiment of the present disclosure, each of the first light source and the second light source comprises: two area light sources provided individually and independently from each other, or an unitary area light source.

According to an exemplary embodiment of the present disclosure, each of the first light source and the second light source comprises: a plurality of point light sources, or a plurality of line light sources, or a combination of a plurality of point light sources and a plurality of line light sources.

According to an exemplary embodiment of the present disclosure, the irradiation assembly further comprises: a light source controller, which is connected with the light source assembly, and configured to control portions of the light source assembly in the first light-emitting region and in the second light-emitting region to switch between respective on and off states respectively, so as to emit either one or both of the first light and the second light.

According to another aspect of the exemplary embodiment of the present disclosure, there is provided a packaging device, comprising: the irradiation assembly according to any one of above embodiments; and the package piece, comprising a first cover plate and a second cover plate aligned and assembled with each other; and the first adhesive material and the second adhesive material configured to encapsulate the electronic components between the first cover plate and the second cover plate; the first adhesive material within the first region and the electronic components are encapsulated within a closed space which is delimited and defined collectively by the first cover plate, the second cover plate, and the second adhesive material within the second region.

According to an exemplary embodiment of the present disclosure, the light source assembly comprises: a first light-emitting region, which is configured to emit the first light and is arranged corresponding to the first region of the package piece; and a second light-emitting region, which is configured to emit the second light and is arranged corresponding to the second region of the package piece; the first light-emitting region configured to emit the first light is located at an orthographic projection position of the first region on a plane where the light source assembly is located, and the second light-emitting region configured to emit the second light is located at an orthographic projection position of the second region on the plane where the light source assembly is located.

According to still another aspect of the exemplary embodiment of the present disclosure, there is provided a packaging method using the packaging device according to any one of above embodiments, the packaging method comprising: placing the package piece above the irradiation assembly and aligning the package piece with the irradiation assembly; and heating the first adhesive material within the first region of the package piece by using the first light emitted by the light source assembly, and curing the second adhesive material within the second region of the package piece by using the second light emitted by the light source assembly.

According to an exemplary embodiment of the present disclosure, the irradiation assembly further comprises a light source controller which is connected with the light source assembly; and heating the first adhesive material within the first region of the package piece by using the first light emitted by the light source assembly, and curing the second adhesive material within the second region of the package piece by using the second light emitted by the light source assembly comprising: controlling respective portions of the light source assembly in the first light-emitting region and in the second light-emitting region to emit the first light and the second light, by the control of the light source controller, so as to heat the first adhesive material within the first region of the package piece with the first light and to cure the second adhesive material within the second region of the package piece with the second light.

According to an exemplary embodiment of the present disclosure, heating the first adhesive material within the first region of the package piece by using the first light emitted by the light source assembly, and curing the second adhesive material within the second region of the package piece by using the second light emitted by the light source assembly comprising: controlling the portion of the light source assembly in the second light-emitting region to emit the second light, by the control of the light source controller, so as to cure the second adhesive material within the second region of the package piece with the second light; and controlling the portion of the light source assembly in the second light-emitting region to stop emitting the second light, and in turn controlling the portion of the light source assembly in the first light-emitting region to emit the first light subsequently, by the control of the light source controller, so as to heat the first adhesive material within the first region of the package piece by using the first light.

According to an exemplary embodiment of the present disclosure, a curing time of the second adhesive material is defined as a first time and a temperature rising time of the first adhesive material from an original temperature to a diffusion temperature thereof is defined as a second time, the first time being smaller or equal to the second time.

According to an exemplary embodiment of the present disclosure, after placing the package piece above the irradiation assembly, the packaging method further comprises: aligning the package piece and the irradiation assembly with each other to locate the first light-emitting region configured to emit the first light at an orthographic projection position of the first region of the package piece on a plane where the light source assembly is located, and to locate the second light-emitting region configured to emit the second light at an orthographic projection position of the second region of the package piece on a plane where the light source assembly is located.

According to an exemplary embodiment of the present disclosure, the packaging method further comprises: curing the first adhesive material after the first adhesive material in the package piece completes its diffusion upon being heated.

According to an exemplary embodiment of the present disclosure, wherein the step of 'controlling respective portions of the light source assembly in the first light-emitting region and in the second light-emitting region to emit the first light and the second light, by the control of the light source controller, so as to heat the first adhesive material within the first region of the package piece with the first light and to cure the second adhesive material within the second region of the package piece with the second light' comprises:

controlling respective portions of the light source assembly in the first light-emitting region and in the second light-emitting region to emit the first light and the second light simultaneously, by the control of the light source controller, so as to heat the first adhesive material within the first region of the package piece with the first light and to cure the second adhesive material within the second region of the package piece with the second light concurrently.

BRIEF DESCRIPTION OF THE DRAWINGS

Accompanying drawings are to be used to provide a further understanding of the present disclosure and to constitute a part of the specification, and are to be comprehended together with the embodiments of the disclosure for facilitating interpretation of technical solutions of the disclosure, rather than being construed as a limitation to the technical schemes of the present disclosure.

FIG. 10(*b*) illustrates a flow chart of a packaging method according to another embodiment of the disclosure.

DETAILED DESCRIPTION OF PREFERRED EMBODIMENTS OF THE INVENTION

Figure 1:
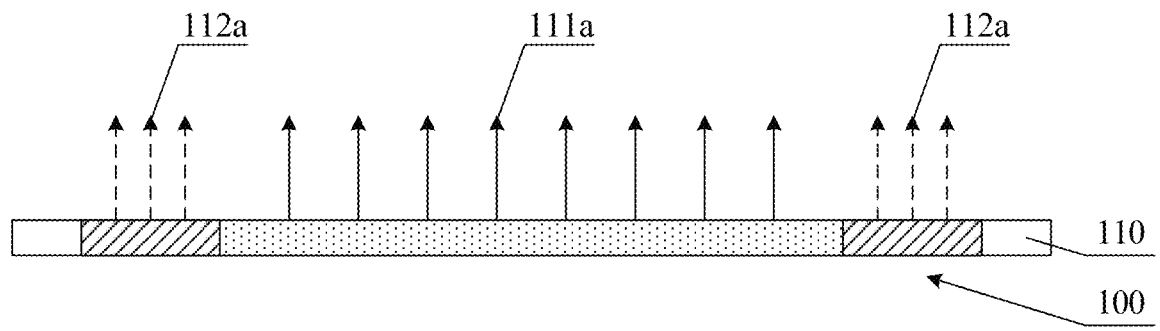
FIG. 1 illustrates a structural schematic view of an irradiation assembly according to an embodiment of the disclosure.

In a relevant packaging technology with DAM & FILL, there exist two problems as below: on the one hand, the filling adhesive (i.e., FILL) may not sufficiently diffuse, resulting in air bubbles being produced within space which would have been (i.e., is expected to be, but is essentially not) filled up with the filling adhesive; on the other hand, during a diffusion process of the filling adhesive, it may impact on the adhesive dam (i.e., DAM) which surrounds and encapsulates the filling adhesive, which may in turn readily result in damage and defects of the adhesive dam. As such, above packaging technology with DAM & FILL may possibly have two improvement ways which may contradict with each other, i.e., avoiding generation of air bubbles due to diffusion of the filling adhesive and avoiding damage of the adhesive dam (i.e., DAM). Specifically, by way of example, on one hand, if it is desired to avoid production of air bubbles due to diffusion of the filling adhesive, then it may be required to decrease viscosity of the filling adhesive so as to ensure that it may be readily flowable to diffuse; accordingly, a commonly adopted way therefor is typically heating. However, during heating of the filling adhesive, the adhesive dam may be heated simultaneously, resulting in a decreased viscosity and a lowered impact/shock resistance of the adhesive dam; therefore, the adhesive dam may be readily damaged by the filling adhesive being diffusing to impact/shock against the adhesive dam, incurring damage and defects in the adhesive dam. By way of example, on the other hand, if it is desired to increase hardness of the adhesive dam so as to intend to at least partially resist or completely eliminate shock/impact applied thereon by the filling adhesive during the diffusion of the latter, then it is required to cure the adhesive dam; accordingly, a commonly adopted way therefor is typically curing the adhesive dam by a certain degree of ultraviolet (abbreviated as UV) irradiation. However, ultraviolet light may also irradiate the filling adhesive such that the filling adhesive may then be cured to a certain extent upon the UV irradiation applied thereon, resulting in an increased viscosity which is adverse to diffusion of the filling adhesive and may readily facilitate production of air bubbles. It is apparent that, it may be difficult to obtain a compromise in solving a double-sided problem of generation of air bubbles due to diffusion of the filling adhesive and damage of the adhesive dam due to impact/shock applied thereon due to diffusion of the filling adhesive, in the relevant art.

In order to make technical purposes, technical solutions and advantages of the embodiments of the present disclosure more clear, the embodiments of the present disclosure will be described in detail below with reference to the accompanying drawings. It should be noted that the embodiments of the present disclosure and the features in the embodiments may be freely combined with each other in case of no conflicts.

In the following detailed description, for facilitating a thorough and comprehensive understanding of the embodiments of the disclosure, numerous specific details are set forth hereinafter. It will be apparent, however, that one or more embodiments may be practiced by other ways different from those described herein; therefore, a scope of protection of embodiments of the disclosure may not be limited by following specific embodiments of the disclosure as below.

Respective dimension and shape of each component in the drawings are only intended to exemplarily illustrate the contents of the disclosure, rather than to demonstrate the practical dimension or proportion of components of an irradiation assembly, and a packaging device according to an embodiment of the disclosure.

According to a general technical concept of the embodiments of the disclosure, in an aspect of embodiments of the disclosure, as illustrated, by way of example, FIG. 1 illustrates a structural schematic view of an irradiation assembly according to an embodiment of the disclosure. The irradiation assembly 100 provided in the embodiment is configured to heat and cure a package piece to be irradiated, and is for example arranged adjacent to and opposite to the package piece to be irradiated; and it is more specifically configured to heat the package piece having a construction of DAM & FILL so as to achieve a purpose of effective package. The package piece is aligned with the irradiation assembly and has a first region and a second region, the first region being provided with a first adhesive material therein and the second region being provided with a second adhesive material therein, the second adhesive material being different from the first adhesive material. And the irradiation assembly 100 for example comprises a light source assembly 110. The light source assembly 110 is configured to emit a first light 111*a* heating the first adhesive material within the first region of the package piece and to emit a second light 112*a* curing the second adhesive material within the second region of the package piece. According to an example, the package piece is for example an assembly configured to encapsulate electronic components accommodated therein, the first region of the package piece is provided with the electronic components and is filled up with the first adhesive material encapsulating the electronic components, and the second region of the package piece is arranged at periphery of the first region and is filled with the second adhesive material surrounding the first adhesive material.

Figure 2:
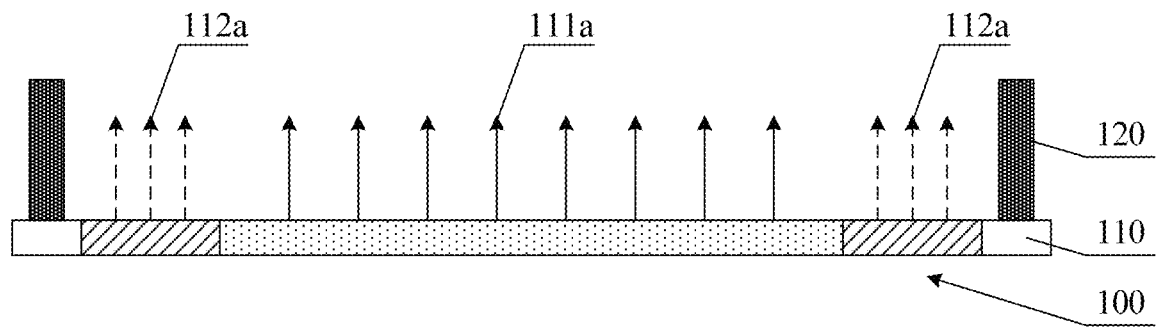
FIG. 2 illustrates a structural schematic view of an irradiation assembly according to another embodiment of the disclosure.

Specifically, for example, in an embodiment of the disclosure, when the irradiation assembly 100 is used to heat the package piece, for example, the package piece is arranged adjacent to and opposite to the package piece to be irradiated, and more specifically arranged immediately/right above the irradiation assembly 100, and the package piece to be irradiated and the irradiation assembly 100 are in a non-contact relative position relationship with each other. In an implementation of the disclosure, by way of example, the package is supported at a corresponding position right above the irradiation assembly 100 by a supporting frame independently of the irradiation assembly 100. In another implementation of the disclosure, for example, supporting columns 120 which are configured to support the package piece is additionally provided in the irradiation assembly 100, as illustrated in FIG. 2, which illustrates a structural schematic view of an irradiation assembly according to another embodiment of the disclosure. In a practical application, the supporting columns 120 are for example provided on a side of the light source assembly 110 facing towards the package piece and configured to support the package piece to be processed, such that the package piece is located at a corresponding location right above the light source assembly 110 (for example, the first region of the package piece to be irradiated by the first light 111*a* is in a one-to-one opposing relationship, and further in a one-to-one alignment relationship with a portion of the irradiation assembly configured to emit the first light 111*a*; and for example, the second region of the package piece to be irradiated by the second light 112*a* is in a one-to-one opposing relationship, and further in a one-to-one alignment relationship with a portion of the irradiation assembly configured to emit the second light 112*a*), for example with a distance being left between the package piece and the light source assembly.

It should be noticed that, specific number and locations of the supporting columns 120 may not be limited in embodiments of the disclosure (for example, the supporting columns 120 are in a form of dots and distributed on a plane where the light source assembly 110 is located; and alternatively, for example, a plurality of supporting columns 120 are provided at a periphery of the light source assembly 110 and spaced part from one another), and any specific setting in which only if the supporting columns 120 may function to have a supporting effect for the package piece to be irradiated and may not influence irradiation effects may be applied into the embodiments of the disclosure.

Figure 3:
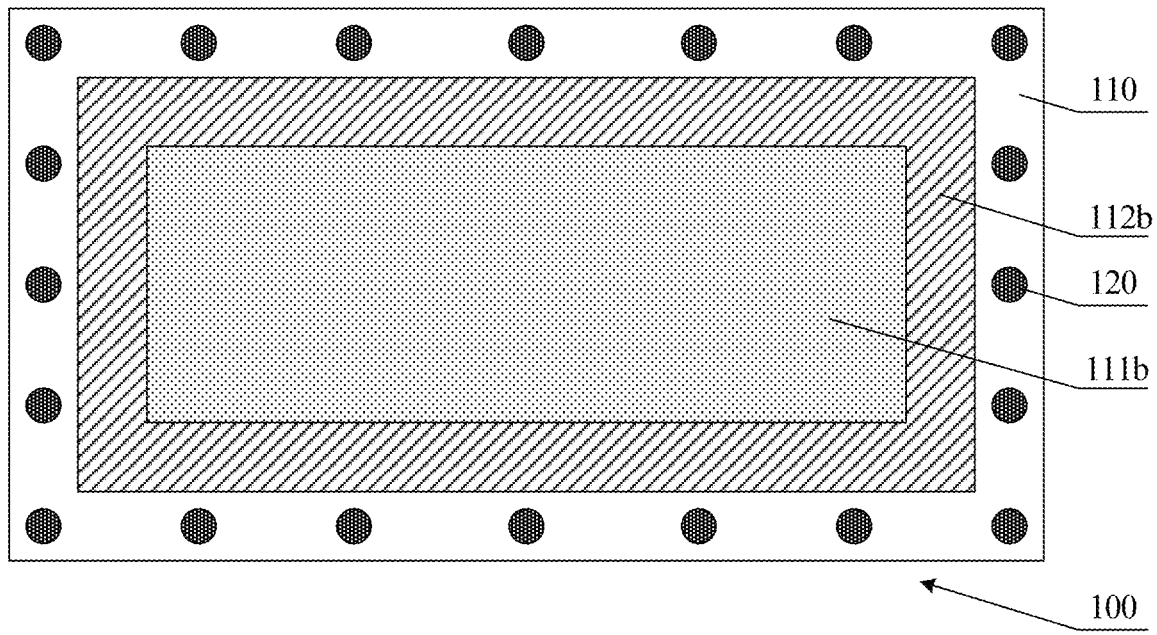
FIG. 3 illustrates a schematic top view of the irradiation assembly according to the another embodiment of the disclosure.

The light source assembly 110 in embodiments of the disclosure may for example emit two types of light having different functionalities from each other, i.e., a first light 111*a* and a second light 112*a*, which are provided respectively for the package piece having the construction of DAM & FILL, by the light source assembly 110. And the package piece having a construction of DAM & FILL comprises: a first adhesive material which is filled within a package structure of the package piece and configured to protect electronic components in the package structure, for example, a filling adhesive; and a second adhesive material which is provided at the periphery of package structure and configured to function as a sealing structure which encapsulates the package structure, for example, an adhesive dam. Specifically, the first light 111*a* emitted by the light source assembly 110 is designed for the first adhesive material in the package piece; and in consideration of requirements on the first adhesive material (i.e., the filling adhesive) within the package piece, i.e., it is required that the first adhesive material has a relatively lower viscosity and a relative finer diffusion property as compared with the second adhesive material, therefore for example the first adhesive material is processed by heating applied by a light which mainly functions to exert a heating effect on adhesive material (i.e., which functions as the first light 111*a*), so as to obtain an effect of diffusing the first adhesive material sufficiently, and to avoid production of air bubbles within space which would have been (i.e., is expected to be, but is essentially not) filled up with the first adhesive material due to insufficient diffusion of the first adhesive material. And specifically, the second light 112*a* is designed for the second adhesive material in the package piece; and in consideration of requirements on the second adhesive material (i.e., the adhesive dam) within the package piece, i.e., it is required that the second adhesive material has a relatively high hardness and a relatively fine impact/shock resistance property as compared with the first adhesive material, therefore for example the second adhesive material is processed by curing by a light which mainly functions to implement a curing effect on adhesive material (i.e., which functions as the second light 112*a*), so as to avoid any damage and defects of the second adhesive material caused by impact applied thereon due to the diffusion of the first adhesive material. In practical applications, based on actions of the first light 111*a* and the second light 112*a* according to the embodiment of the disclosure, then specific positions of light-emitting regions within the light source assembly 110 for emitting these two types of light may for example be set corresponding to positions of the first adhesive material and the second adhesive material of the package piece; in other words, the light source assembly 110 comprises: a first light-emitting region 111*b*, which is configured to emit the first light 111*a* and is arranged corresponding to the first region of the package piece; and a second light-emitting region 112*b*, which is configured to emit the second light 112*a* and is arranged corresponding to the second region of the package piece. By way of example, the first light-emitting region 111*b* configured to emit the first light 111*a* is located in a central region which occupies a relatively large area within the light source assembly 110, and the second light-emitting region 112*b* configured to emit the second light 112*a* is located surrounding the first light-emitting region 111*b*. As illustrated in FIG. 3, which illustrates a schematic top view of the irradiation assembly according to the another embodiment of the disclosure, a relative position relationship between the first light-emitting region 111*b* and the second light-emitting region 112*b* is schematically illustrated therein, and positions of the supporting columns 120 on the light source assembly 110 are also schematically shown; for example, the supporting columns 120 are provided at intervals around the light source assembly 110 (e.g., they are located at a periphery of the light source assembly 110 on an external side of the second light-emitting region 112*b* and spaced part from one another), as shown in FIG. 3.

It should be noticed that, based on corresponding positional relationships between the first light-emitting region 111*b* configured to emit the first light 111*a* within the light source assembly 110 and the first adhesive material within the package piece, and between the second light-emitting region 112*b* configured to emit the second light 112*a* within the light source assembly 110 and the second adhesive material within the package piece, with reference to specific positions of the first light-emitting region 111*b* and the second light-emitting region 112*b* as illustrated in FIG. 3, it may be known that, when the irradiation assembly 100 is used to irradiate the package piece, the first light-emitting region 111*b* is located at an orthographic projection position of the first region on a plane where the light source assembly 110 is located, for example an area coverage of the first light-emitting region 111b within the light source assembly 110 at least comprises the orthographic projection of the first region on the plane where the light source assembly 110 is located; and the second light-emitting region 112b is located at an orthographic projection position of the second region on the plane where the light source assembly 110 is located, for example an area coverage of the second light-emitting region 112b within the light source assembly 110 at least comprises the orthographic projection of the second region on the plane where the light source assembly 110 is located. It may be understood that, in order to obtain a relatively fine heating and curing effects, in a condition that each of the first light 111a and the second light 112a emitted by the light source assembly 110 is for example parallel light (or otherwise referred to as collimated light) emitted in the form of an area light (i.e., a surface light), then the first light 111a and the second light 112a received respectively by corresponding positions of the package piece 200 (specifically, the first light 111a is received by the first region and the second light 112a is received by the second region) have their respective maximal illumination intensities. Therefore, it is an optimized setting for providing optimal effects on heating the first adhesive material and on curing the second adhesive material respectively that the first light-emitting region 111b is located at the orthographic projection position of the first region on the plane where the light source assembly 110 is located, and the second light-emitting region 112b is located at the orthographic projection position of the second region on the plane where the light source assembly 110 is located.

In a relevant packaging technology with DAM & FILL, there is contradictoriness between two specific performance-improvement ways, i.e., one is intended to avoid generation of air bubbles due to diffusion of the filling adhesive and the other is intended to avoid damage of the adhesive dam. Specifically, by way of example, on one hand, if it is desired to avoid production of air bubbles due to diffusion of the filling adhesive, then it may be required to decrease viscosity of the filling adhesive so as to ensure that it may be readily flowable to diffuse; accordingly, a commonly adopted way therefor is typically heating. However, during heating of the filling adhesive, the adhesive dam may also be heated simultaneously, resulting in a decreased viscosity and a lowered impact/shock resistance of the adhesive dam; therefore, the adhesive dam may be readily damaged by the filling adhesive diffusing to impact/shock against the adhesive dam, incurring damage and defects in the adhesive dam. By way of example, on the other hand, if it is desired to increase hardness of the adhesive dam so as to intend to at least partially resist or completely eliminate shock/impact applied thereon by the filling adhesive during the diffusion of the latter, then it is required to cure the adhesive dam; accordingly, a commonly adopted way therefor is typically curing the adhesive dam by a certain degree of ultraviolet (abbreviated as UV) irradiation. However, ultraviolet light may also irradiate the filling adhesive such that the filling adhesive may then be cured to a certain extent upon the UV irradiation applied thereon, resulting in an increased viscosity which is adverse to diffusion of the filling adhesive and may readily facilitate production of air bubbles within space which would have been (i.e., is expected to be, but is essentially not) filled up with the filling adhesive. It is apparent that, it may be difficult for the relevant packaging technology with DAM & FILL to obtain a compromise in solving a double-sided problem of generation of air bubbles due to diffusion of the filling adhesive and damage of the adhesive dam due to impact/shock applied thereon due to diffusion of the filling adhesive.

As far as the irradiation assembly 100 according to the embodiment of the disclosure is concerned, the light source assembly 110 emitting both the first light 111a and the second light 112a is provided herein, during a heating applied by which the package piece is placed at a corresponding position above the irradiation assembly 100; and then, the first light 111a as emitted is used to heat the first adhesive material in the first region of the package piece, decreasing the viscosity of the first adhesive material functioning as the filling adhesive and thus facilitating its diffusion, avoiding insufficient diffusion and the air bubbles which are in turn caused due to existence of space which would have been but is essentially not filled up with the filling adhesive; and the second light 112a as emitted is used to cure the second adhesive material in the second region of the package piece, increasing the hardness and the impact/shock resistance of the second adhesive material, so as to prevent the adhesive dam from being impacted by the filling adhesive and in turn to avoid any damage and defects thus would have been in turn caused. As far as the irradiation assembly 100 according to the embodiment of the disclosure is concerned, by designing light-emitting types of the light source assembly reasonably, it solves the problem of air bubbles caused by insufficient diffusion of the filling adhesive in the relevant packaging technology, and also solves the problem of damage and defects of the adhesive dam due to impact/shock applied thereon by diffusion of the filling adhesive, simultaneously.

By way of example, according to the embodiment of the disclosure, the first light 111a is for example a visible light, and the visible light emitted by the light source assembly 110 (for example its first light-emitting region 111b) may produce heat, and in turn implement a heating effect applied on the first adhesive material; and the second light 112a is for example a ultraviolet (UV) light, and the UV light emitted by the light source assembly 110 (for example its second light-emitting region 112b) possesses a functionality of curing the adhesive material with UV so as to enable the curing effect on the second adhesive material.

It should be noticed that, in the embodiments of the disclosure, the first light 111a is not merely limited to the visible light and the second light 112a is not merely limited to the UV light; and any 'first light' which may apply a heating effect on the first adhesive material in the package piece may function as the first light 111a which is emitted by the light source assembly 110 in the embodiment of the disclosure, similarly, any 'second light' which may exert a curing effect on the second adhesive material in the package piece may function as the second light 112a which is emitted by the light source assembly 110 in the embodiment of the disclosure.

Figure 4:
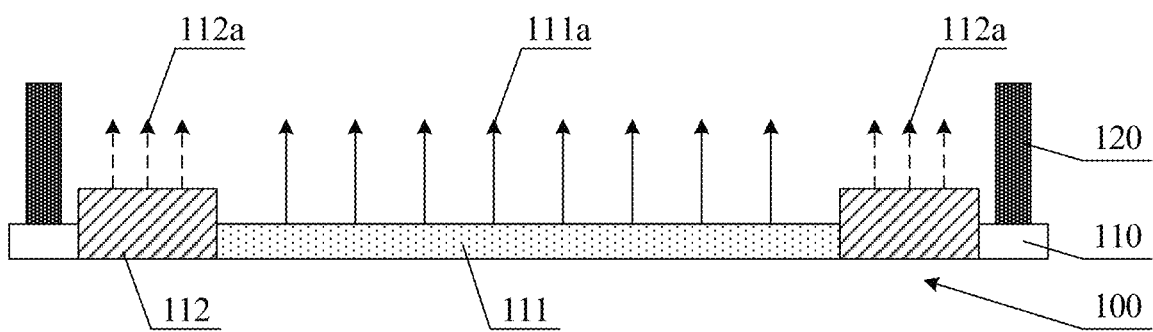
FIG. 4 illustrates a structural schematic view of an irradiation assembly according to still another embodiment of the disclosure.

In some embodiments of the disclosure, in the light source assembly, a light source configured to emit the first light 111a and another light source configured to emit the second light 112a are for example light sources provided individually and separately from each other, i.e., these two types of light are emitted by different light sources, respectively. As illustrated in FIG. 4, it illustrates a structural schematic view of an irradiation assembly according to still another embodiment of the disclosure, and the light source assembly 110 in the embodiment of the disclosure for example comprises: a first light source 111 configured to emit the first light 111a and provided within the first light-emitting region; and a second light source 112 configured to emit the second light 112a and provided within the second light-emitting region.

By way of example, the first light source 111 is for example a visible light source formed by one or more heating lamps, and the second light source 112 is for example a UV light source formed by one or more ultraviolet light generators.

Figure 5:
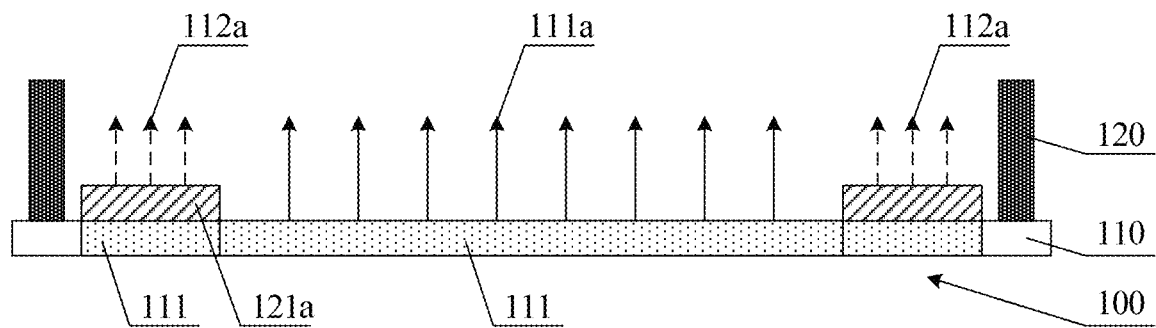
FIG. 5 illustrates a structural schematic view of an irradiation assembly according to yet another embodiment of the disclosure.

FIG. 5 illustrates a structural schematic view of an irradiation assembly according to yet another embodiment of the disclosure. On the basis of the structure of the irradiation assembly 100 according to the embodiments as illustrated in FIG. 1 to FIG. 3, the light source assembly 110 herein for example comprises: a first light source 111 provided in both the first light-emitting region and the second light-emitting region respectively and configured to emit the first light 111a; and a light conversion layer 121a provided on a portion of the first light source 111 being located within the second light-emitting region at a side of the first light source facing the package piece, i.e., the light conversion layer 121a being provided at an orthographic projection position of the second region of the package piece on the plane where the first light source 111 is located. And the light conversion layer 121a is configured to convert a portion of the first light 111a emitted by the portion of the first light source 111 being located within the second light-emitting region into the second light 112a. FIG. 5 for example illustrates such an example on the basis of the structure of the irradiation assembly 100 as illustrated in FIG. 2.

In some embodiments of the disclosure, the light source of the first light 111a and the light source of the second light 112a are for example provided neither individually nor independently from each other. In the structure of the embodiment as illustrated in FIG. 5, light sources of the light source assembly 110 in practice merely comprises a light source emitting the first light 111a, i.e., the first light source 111; the light source of the second light 112a is not individually provided; in other words, it is an 'equivalent' second light source which is obtained by a conversion process applied on the first light 111a emitted from the first light source 111, rather than a light source which may emit the second light directly. In a practical application, the light conversion layer 121a is provided at a position on the first light source 111 corresponding to the second adhesive material of the package piece, and the portion of the first light 111a emitted from the portion of the first light source 111 being located in the second light-emitting region propagates through the light conversion layer 121a and for example is converted there into the second light 112a; therefore, an effect of emitting the second light 112a may be obtained by a combination of the first light source 111 and the light conversion layer 121a; i.e., the equivalent light source of the second light 112a is formed by a combinational structure of 'the first light source 111 plus the light conversion layer 121a'.

In some embodiments of the disclosure, original light sources for both the first light 111a and the second light 112a may substantially be the first light source 111, therefore, the first light source 111 is for example provided across a surface of the whole light source assembly 110 facing toward the package piece, e.g., at a position of the light source assembly 110 as illustrated in FIG. 3; in addition, since the light conversion layer 121a in the embodiment of the disclosure is used to convert the portion of the first light 111a emitted by the portion of the first light source being located in the second light-emitting region into the second light 112a, then its position should be set at a same position as that of the second light source 112 in the embodiment as illustrated in FIG. 3, e.g., set in a peripheral region of the first light source 111, i.e., at the position of the light source of the second light 112a as illustrated in FIG. 3.

In some embodiment of the disclosure, the light conversion layer 121a is for example formed by a transparent resin doped with an upconversion material. And based on both an upconversion light-emitting property and a desired light conversion functionality of the light conversion layer 121a for the light being incident thereon, a requirement on the light conversion layer 121a in the embodiment of the disclosure may be concluded as 'translucency' or 'light transmittance', i.e., the light conversion layer 121a is capable of converting the portion of the first light emitted by the portion of the first light source being located in the second light-emitting region into the second light and irradiating the second light onto the second adhesive material. Therefore, for example, by applying the transparent resin doped with the upconversion material onto the first light source 111, and curing the transparent region doped with the upconversion material as applied, the functionality of the light conversion layer 121a may be implemented.

In practical application, also by taking a condition that the visible light functions as the first light 111a and the UV light functions as the second light 112a as an example, in such an application scenario, the upconversion material contained in the transparent region as applied/coated which functions as the light conversion layer 121a may for example be a visible-ultraviolet upconversion material.

Specifically, in such an application scenario, the second light for curing the second adhesive material is for example UV light; therefore, it is required that the visible light (the first light) is to be converted into UV light (the second light), and then the visible-ultraviolet upconversion material may be accordingly selected as the upconversion material. The visible light emitted by the visible light source may be irradiated to the transparent resin doped with the visible-ultraviolet upconversion material, then the visible light which propagates into the transparent resin is converted into the UV light and in turn exits from the light conversion layer 121a and irradiates the second adhesive material of the second region so as to cure the second adhesive material, enhancing the hardness and the impact/shock resistance of the second adhesive material to prevent the second adhesive material from being subject to damage or defects caused by the impact of the filling adhesive.

It should be noticed that, the visible-ultraviolet upconversion material is an optical-energy conversion material which is capable of absorbing visible light and then converting it into UV light. An operational principle of the upconversion material is 'anti-Stokes luminescence'; in other words, once atoms absorb characteristic radiation of the light source, valence electrons of the atoms transit to higher energy level(s) and then transit back to ground state or to relatively low energy level(s), and also emit fluorescence having its own wavelength smaller than that of radiations excited by the light source simultaneously, such a process is referred to as 'anti-Stokes luminescence'.

Then $Er_3$+.$NaYF_4$ (i.e., $Er_3$ doped with $NaYF_4$) which functions as the visible-ultraviolet upconversion material is taken as an example hereinafter for illustration.

A synthesis method for above $Er_3$+.$NaYF_4$ is concluded as follows: Chemical materials of NaF, $Y_2O_3$, and $Er_2O_3$ are weighed and fetched by ratios of amount of substance thereamong being 80:10:0.5; and $Y_2O_3$, and $Er_2O_3$ are dissolved in a certain amount of boiled nitric acid to prepare a solution A, and NaF is dissolved in another certain amount of deionized water to prepare a solution B; then the solution A is slowly dripped into the solution B with a magnetic stirring at 40° C. so as to prepare a transparent colloidal sol, and the stirring is implemented continuously until solvents contained in the colloidal sol evaporate; and next a drying process for 24 hours at 100° C. is applied thereon so as to obtain a xerogel (i.e., dried gel) which is subsequently preserved at a temperature maintained at 400° C. for 3 hours; and finally, the xerogel is ground to prepare a sample of powders of the visible-ultraviolet upconversion material which is desired (i.e., $Er_3$ doped with $NaYF_4$, which is abbreviated as $Er_3$+.$NaYF_4$ throughout the disclosure).

In addition, characteristics of the visible-ultraviolet upconversion material as prepared above are as follows: on the one hand, with an excitation of a visible light having its wavelength 460 nm, the sample has three relatively strong upconversion light emission peaks appearing in a wavelength coverage/range of 350 nm to 375 nm; on the other hand, with reference to electrons transition mechanism of the element 'Er', transition energy levels of these three upconversion light emission peaks may be depicted as below, i.e., corresponding to respectively: a: $2I11/2 \rightarrow 4I9/2$ (350 nm), b: $4G11/2 \rightarrow 4I15/2$ (363 nm), c: $2H9/2 \rightarrow 4H11/2$ (374 nm), with a light conversion efficiency of the visible-ultraviolet upconversion material being between 5% and 10%.

In an implementation of embodiments of the disclosure, aforementioned light source assembly 110 for example comprises light sources in both the first light-emitting region 111*b* and the second light-emitting region 112*b* in FIG. 3, and types of the light sources in these two light-emitting regions may for example comprise any one of area light sources, line light sources, and point light sources, or a combination thereof. In addition, specific number of the light sources may for example be one or more, depending on specific types of the light sources in the light source assembly 110. By way of example, one or more light sources in the first light-emitting region 111*b* for emitting the first light 111*a* and one or more light sources in the second light-emitting region 112*b* for emitting the second light 112*a* are both area light sources, and the one or more light sources for emitting the first light 111*a* and the one or more light sources for emitting the second light 112*a* are for example two area light sources provided individually and independently from each other (i.e., the embodiment as illustrated in FIG. 4); and alternatively, for example, an unitary area light source may be used instead (i.e., the embodiment as illustrated in FIG. 5), as such, a uniform heating applied on the first adhesive material may be facilitated, and also a uniform curing applied on the second adhesive material may also be facilitated. Again, by way of example, in practical application, since it is more convenient to provide point light sources or line light sources than area light sources, then, point light sources or line light sources may for example be used as the light sources in the embodiment of the disclosure, i.e., the light sources for the first light-emitting region 111*b* and for the second light-emitting region 112*b* according to the embodiment of the disclosure may for example be formed by a plurality of point light sources, or a plurality of line light sources, or a combination of a plurality of point light sources and a plurality of line light sources.

Figure 7:
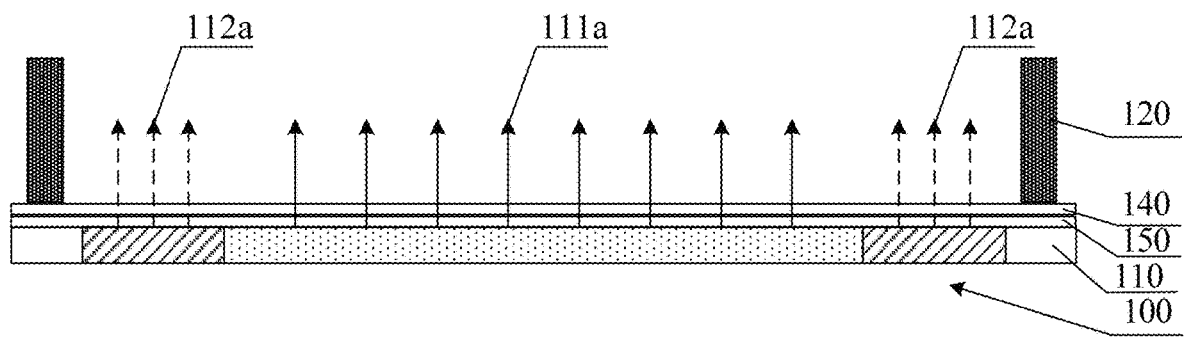
FIG. 7 illustrates a structural schematic view of an irradiation assembly according to still yet another embodiment of the disclosure.

In another implementation of embodiments of the disclosure, for example with reference to FIG. 7, the irradiation assembly 100 may for example comprise: a diffusion layer 150 covering the light source assembly 110. The light source assembly 110 in the form of point light source(s) or line light source(s), cooperate with the diffusion layer 150 to obtain a light-emitting effect of an equivalent area light source, and the diffusion layer 150 is for example a diffusion plate. In such a structure, as illustrated in FIG. 7, the supporting columns 120 are specifically provided on the diffusion layer.

Furthermore, in still another implementation of embodiments of the disclosure, for example with reference to FIG. 7, the irradiation assembly 100 may for example comprise: a layer of transparent cover plate 140. Specifically, the layer of transparent cover plate 140 covers the light source assembly 110 in the form of area light source and is configured to protect the light source assembly 110, or alternatively covers the structure of the diffusion layer 150 which cooperates with the light source assembly 110 and is configured to protect the diffusion layer 150. The transparent cover plat 140 is for example a transparent glass plate or a transparent resin plate. In such a structure, the supporting columns 120 are specifically provided on the transparent cover plate 140.

Figure 6:
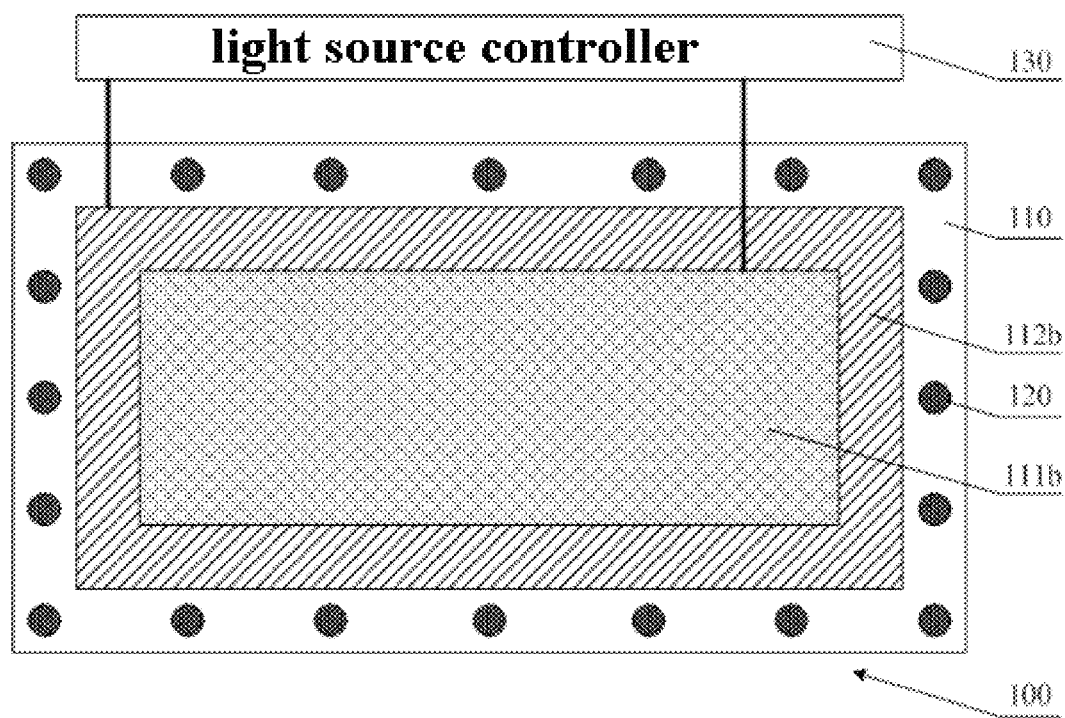
FIG. 6 illustrates a structural schematic view, e.g. shown as a top view, of an irradiation assembly according to yet another embodiment of the disclosure.

FIG. 6 illustrates a structural schematic view, e.g. shown as a top view, of an irradiation assembly according to yet another embodiment of the disclosure. On the basis of the structure of the irradiation assembly 100 according to above embodiments of the disclosure, the irradiation assembly 100 in the embodiment of the disclosure for example further comprises: a light source controller 130, which is connected with the light source assembly 110, and configured to control portions of the light source assembly in the first light-emitting region 111*b* and in the second light-emitting region 112*b* to switch between respective on and off states respectively, so as to emit the first light 111*a*, or the second light 112*a*, or both the first light 111*a* and the second light 112*a*. The embodiment as illustrated in FIG. 6 is shown on the basis of the structure of the irradiation assembly 100 as illustrated in FIG. 3. It should be noticed that, in FIG. 6, a connection relationship between the light source controller 130 and both the first light-emitting region 111*b* and the second light-emitting region 112*b* of the light source assembly is schematically shown so as to represent that the light source controller 130 is in respective connection relationship with light sources in these two regions, rather than to represent any internal connection relationship and proportional relationship. And it should be noticed that, FIG. 6 merely schematically shows an overall structure of the light source assembly 110, rather than any specific structure of each light source in the light source assembly 110, and the light sources in the first light-emitting region 111*b* and the second light-emitting region 112*b* may for example be a combination of one or more of point light sources, line light sources, area light source(s) according to above embodiments, and the light sources in these two regions may for example be set in an identical manner/arrangement or in different manners/arrangements.

In the embodiment of the disclosure, for example, each light source in the light source assembly 110 is provided with a switch control function, e.g., the light sources in the first light-emitting region 111*b* and the second light-emitting region 112*b* are respectively connected to the light source controller 130 which is for example configured to control portions of the light source assembly in the first light-emitting region 111*b* and in the second light-emitting region 112*b* to switch between respective on and off states respectively. By way of example, in the structure of the irradiation assembly in the embodiment as illustrated in FIG. 3, the first light source 111 is located within the first light-emitting region 111*b* and the second light source 112 is located within the second light-emitting region 112*b*, and the light source controller 130 may for example control turning on the first light source 111 or the second light source 112 individually, and may also for example control turning on both the first light source 111 and the second light source 112 simultaneously, such that a hardware basis is provided for heating and curing processes in a packaging method as provided hereinafter in embodiments of the disclosure.

Figure 8:
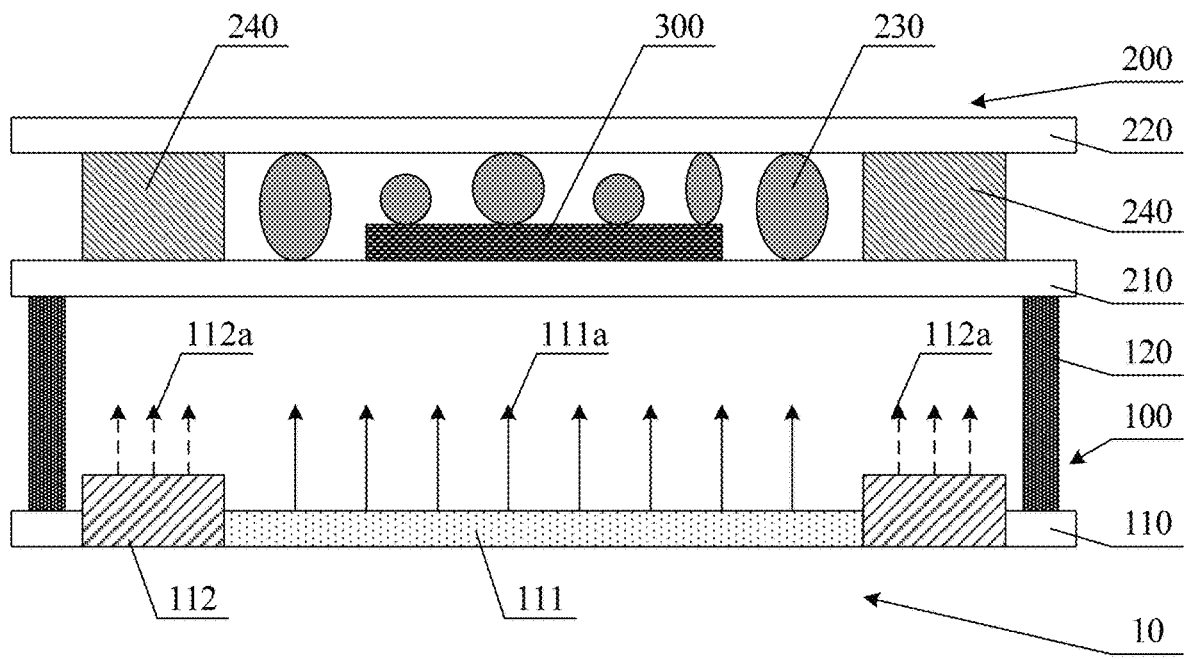
FIG. 8 illustrates a structural schematic view of a packaging device according to an embodiment of the disclosure.

On the basis of the irradiation assembly 100 according to above embodiments of the disclosure, a packaging device is further provided in an embodiment of the disclosure, as illustrated in FIG. 8 which illustrates a structural schematic view of a packaging device according to an embodiment of the disclosure, and the packaging device 10 comprises the irradiation assembly 10 according to any one embodiment as illustrated in FIG. 1 to FIG. 7 as above. The embodiment as illustrated in FIG. 8 is for example shown on the basis of an irradiation assembly which takes the irradiation assembly 100 as illustrated in FIG. 3 as an example.

The packaging device 10 further comprises a package piece 200, which comprises: two cover plates aligned and assembled with each other, i.e., a bottom cover plate 210 and a top cover plate 220; and a first adhesive material 230 and a second adhesive material 240 disposed between the bottom cover plate 210 and the top cover plate 220 and configured to package/encapsulate electronic components 300 sandwiched between these two cover plates. And the first adhesive material 230 within the first region and the electronic components 300 are encapsulated within a closed space which is delimited and defined collectively by these two cover plates (i.e., bottom cover plate or a first cover plate referred to hereinafter; and the top cover plate or a second cover plate referred to hereinafter) and the second adhesive material 240 within the second region.

It may be understood that, the package piece 200 in the embodiment of the disclosure is an object to be processed by the packaging device, and is a package structure which protect the electronic components 300 encapsulated therein. In the packaging device 10 as illustrated in FIG. 8, the package piece 200 is for example a package piece having a construction of DAM & FILL, in which the first adhesive material 230 is for example a filling adhesive and the second adhesive material 240 is for example an adhesive dam; and in the package piece, the two cover plates which are aligned and assembled with each other cooperate with the second adhesive material 240 within the second region to delimit and define collectively the closed space, and electronic components 300 are provided on the bottom cover plate as illustrated in FIG. 7, and the closed space is further filled up with the first adhesive material 230 within the first region so as to protect the electronic components 300 accommodated therein. Packaging requirements on the package piece 200 having the construction of DAM & FILL lie in that: the closed space is filled up with the first adhesive material 230 so as to protect the electronic components 300 and to ensure sealing performance of the second adhesive material 240 for the closed space.

In an embodiment of the disclosure, the first light 111a emitted by the light source assembly 110 irradiates the first adhesive material 230 within the first region in the package piece 200 so as to heat the first adhesive material, and the second light 112a emitted by the light source assembly 110 irradiates the second adhesive material 240 within the second region in the package piece 200 so as to cure the second adhesive material. Based on different requirements of applying heating and curing processes for different adhesive materials in the package piece 200 by the light source assembly 110, the package piece 200 is provided right over the light source assembly 110 and is secured by the supporting columns which are for example provided independent of the irradiation assembly 100 or alternatively are for example provided inside the irradiation assembly 100, as illustrated in FIG. 2 to FIG. 7; and based on the irradiation assembly 100 as illustrated, in the embodiment as illustrated in FIG. 8, by taking a condition that the package piece 200 is supported by the supporting columns 120 of the irradiation assembly 100 as an example, specific settings of the supporting columns 120 are depicted in details in above embodiments and may not be repeated herein again.

It has been set forth in above embodiments that, on the basis of the principle that the first adhesive material 230 and the second adhesive material 240 in the package piece 200 are processed respectively with the first light 111a and the second light 112a emitted by the light source assembly, the first light-emitting region 111b configured to emit the first light 111a is provided at an orthographic projection position of the first region on the plane where the light source assembly 110 is located, for example, for example an area coverage of the first light-emitting region 111b within the light source assembly 110 at least comprises the orthographic projection of the first region on the plane where the light source assembly 110 is located; and the second light-emitting region 112b configured to emit the second light 112a is located at an orthographic projection position of the second region on the plane where the light source assembly 110 is located, for example an area coverage of the second light-emitting region 112b within the light source assembly 110 at least comprises the orthographic projection of the second region on the plane where the light source assembly 110 is located. It may be understood that, in order to obtain a relatively fine heating and curing effects, in a condition that each of the first light 111a and the second light 112a emitted by the light source assembly is for example parallel light (or otherwise referred to as collimated light) emitted in the form of an area light (i.e., a surface light), then the first light 111a and the second light 112a received respectively by corresponding positions of the package piece 200 (specifically, the first light 111a is received by the first region and the second light 112a is received by the second region) have their respective maximal illumination intensities. Therefore, it is an optimized setting for providing optimal effects on heating the first adhesive material and on curing the second adhesive material respectively that the first light-emitting region 111b is located at the orthographic projection position of the first region on the plane where the light source assembly 110 is located, and the second light-emitting region 112b is located at the orthographic projection position of the second region on the plane where the light source assembly 110 is located.

In a relevant packaging technology with DAM & FILL, there is contradictoriness between two specific performance-improvement ways, i.e., one is intended to avoid generation of air bubbles due to diffusion of the filling adhesive and the other is intended to avoid damage of the adhesive dam. Specifically, by way of example, on one hand, if it is desired to avoid production of air bubbles due to diffusion of the filling adhesive, then it may be required to decrease viscosity of the filling adhesive so as to ensure that it may be readily flowable to diffuse; accordingly, a commonly adopted way therefor is typically heating. However, during heating of the filling adhesive, the adhesive dam may also be heated simultaneously, resulting in a decreased viscosity and a lowered impact/shock resistance of the adhesive dam; therefore, the adhesive dam may be readily damaged by the filling adhesive diffusing to impact/shock against the adhesive dam, incurring damage and defects in the adhesive dam. By way of example, on the other hand, if it is desired to increase hardness of the adhesive dam so as to intend to at least partially resist or completely eliminate shock/impact applied thereon by the filling adhesive during the diffusion of the latter, then it is required to cure the adhesive dam; accordingly, a commonly adopted way therefor is typically curing the adhesive dam by a certain degree of ultraviolet (abbreviated as UV) irradiation. However, ultraviolet light may also irradiate the filling adhesive such that the filling adhesive may then be cured to a certain extent upon the UV irradiation applied thereon, resulting in an increased viscosity which is adverse to diffusion of the filling adhesive and may readily facilitate production of air bubbles within space which would have been (i.e., is expected to be, but is essentially not) filled up with the filling adhesive. It is apparent that, it may be difficult for the relevant packaging technology with DAM & FILL to obtain a compromise in solving a double-sided problem of generation of air bubbles due to diffusion of the filling adhesive and damage of the adhesive dam due to impact/shock applied thereon due to diffusion of the filling adhesive.

The packaging device 10 according to the embodiment of the disclosure, comprises the irradiation assembly 100 in above embodiment, the irradiation assembly 100 being configured to applying heating and curing processes on a packaging object to be processed (i.e., the package piece 200); in addition, depending on structural features and heating principles of the irradiation assembly 100, the package piece 200 has its own structure lying in that, the two cover plates which are aligned and assembled with each other and the second adhesive material 240 located within the second region cooperate with one another to form collectively the closed space, with the first adhesive material 230 being located within the first region and the electronic components 300 being encapsulated within the closed space. In the packaging device 10 according to the embodiment of the disclosure, by designing light-emitting types of the light source assembly reasonably, i.e., the first light 111a emitted by the first light-emitting region 111 of the light source assembly is used to heat the first adhesive material 230, and the second light 112a emitted by the second light-emitting region 112 of the light source assembly is used to cure the second adhesive material 240, it solves the problem of air bubbles caused by insufficient diffusion of the filling adhesive in the relevant packaging technology, and also solves the problem of damage and defects of the adhesive dam due to impact/shock applied thereon by diffusion of the filling adhesive, simultaneously.

In some embodiments of the disclosure, the second adhesive material 240 within the package piece 200 for example comprises: UV light curing adhesive of Model NOA61 or Model NOA65, or frame sealant (i.e., adhesive dam) of Model S-WB21. Here, as far as the UV light curing adhesive of Model NOA61 or Model NOA65 is concerned, a light which is expected to be used to cure such UV light curing adhesive may be a UV light having a fixed wavelength ranging between 350 nm and 380 nm, with a recommended curing intensity of 3 Joule/cm², for a curing time period of 5 min. And as to the frame sealant (i.e., adhesive dam) of Model S-WB21, a light which is expected to be used to cure such frame sealant may be a UV light having a fixed wavelength ranging between 330 nm and 400 nm, with a recommended curing intensity of 5 Joule/cm², for a curing time period of 2 min.

It should be noticed that, once the second adhesive material 240 in the package piece 200 according to the embodiment of the disclosure is cured, it may for example resist a temperature below 130° C. and possess a relatively large hardness and a relatively strong impact/shock resistance; and a temperature at which the viscosity of the first adhesive material 230 may be decreased to enable a sufficient diffusion thereof may typically ranges between 30° C. and 50° C. Therefore, in a condition that the second adhesive material 240 has been cured already, when the first adhesive material 230 is being heated to diffuse sufficiently, the second adhesive material 240 which has been cured may not be influenced.

In some embodiments of the disclosure, by taking the irradiation assembly 100 according to the embodiment as illustrated in FIG. 5 as an example, the first light 111a is for example a visible light, and the second light 112a is for example a UV light. In such a condition, the upconversion material for forming the light conversion layer 121a may for example be selected as the visible-ultraviolet upconversion material. And since the visible-ultraviolet upconversion material has a light conversion efficiency between 5% and 10%, in order to obtain a desired emergent UV light intensity, then an intensity of the visible light incident on the light conversion layer 121a should be 10 to 20 times of the desired emergent UV light intensity. In order to obtain a same level of the desired emergent UV light intensity, it is typical to select different visible light intensities for various specific material types of the second adhesive material 240. By way of example, the intensity of the visible light corresponding to the UV light curing adhesive of Model NOA61 or Model NOA65 should be 30 to 60 Joule/cm², and the intensity of the visible light corresponding to the frame sealant (i.e., adhesive dam) of Model S-WB21 should be 50 to 100 Joule/cm².

On the basis of the irradiation assembly 100 and the packaging device 10 according to above embodiments of the disclosure, a packaging method is further provided in an embodiment of the disclosure, which is used to utilize the packaging device 10 according to any one of the embodiments as above for processing; and in practical application, the irradiation assembly 100 in the packaging device 10 is used to process the packaging object to be processed (i.e., the package piece 200), so as to achieve a purpose of effective package.

Figure 9:
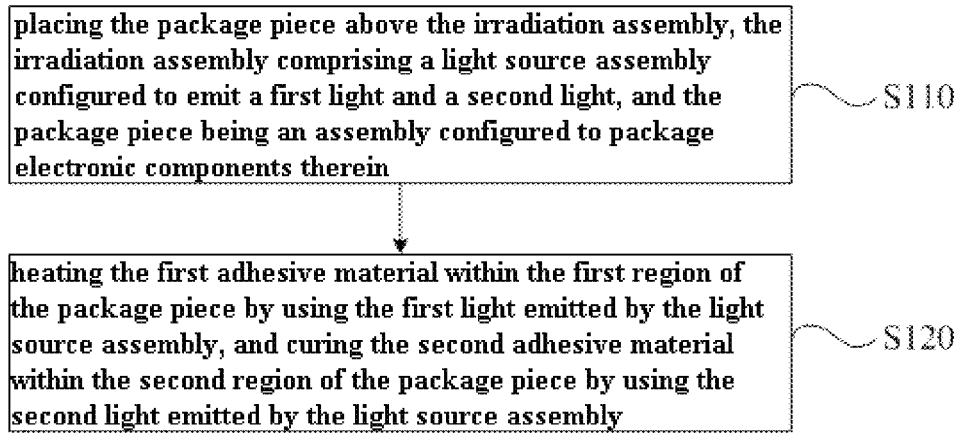
FIG. 9 illustrates a flow chart of a packaging method according to an embodiment of the disclosure.

As illustrated in FIG. 9, it illustrates a flow chart of a packaging method according to an embodiment of the disclosure. The packaging method according to the embodiment may for example be used to process the packaging device according to any one of above embodiments, so as to achieve a purpose of effective packaging. The packaging method according to the embodiment of the disclosure may for example comprise following steps:

S110, placing the package piece above the irradiation assembly (and aligning the package piece with the irradiation assembly), the irradiation assembly comprising a light source assembly configured to emit a first light and a second light, and the package piece being an assembly configured to package/encapsulate electronic components therein; and S120, heating the first adhesive material within the first region of the package piece by using the first light emitted by the light source assembly, and curing the second adhesive material within the second region of the package piece by using the second light emitted by the light source assembly.

In the embodiment of the disclosure, the irradiation assembly is the irradiation assembly according to any one of the embodiments as illustrated in FIG. 1 to FIG. 7, and the package piece is the package piece having the construction of DAM & FILL according to the above embodiments, and the package piece is used to package the electronic components contained therein; and the irradiation assembly may for example emit the first light and the second light, respective light-emitting regions corresponding to these two types of light are set depending on specific arrangement of the package piece having the construction of DAM & FILL, and the package piece comprises structural features including the first adhesive material located within the first region and the second adhesive material located within the second region. The first adhesive material is for example a filling adhesive and the second adhesive material is for example an adhesive dam. A way for processing the package piece by using the light source assembly comprises: using the first light emitted by the first light-emitting region of the irradiation assembly to heat the first adhesive material of the first region in the package piece, and using the second light emitted by the second light-emitting region of the irradiation assembly to cure the second adhesive material of the second region in the package piece.

In the embodiment of the disclosure, on the basis of process requirements on processing the package piece by the irradiation assembly, prior to heating and curing, e.g., the package piece is placed above the irradiation assembly. In practical application, e.g., the package piece is supported at a corresponding position right over the irradiation assembly, by using the supporting columns which are provided independent of the irradiation assembly; alternatively, the package piece may also be supported at a corresponding position right over the irradiation assembly, by providing the structure of the supporting columns within the irradiation assembly. The embodiment as illustrated in FIG. 9 takes a way in which the package piece is supported by the supporting columns provided within the irradiation assembly as an example, the supporting columns are for example provided on the light source assembly, such that the package piece is supported by the supporting columns at a corresponding position right over the light source assembly (for example, the first region of the package piece to be irradiated by the first light is in a one-to-one opposing relationship, and further in a one-to-one alignment relationship with the first light-emitting region of the irradiation assembly configured to emit the first light; and for example, the second region of the package piece to be irradiated by the second light is in a one-to-one opposing relationship, and further in a one-to-one alignment relationship with the second light-emitting region of the irradiation assembly configured to emit the second light), for example with a distance being left between the package piece and the light source assembly.

In the embodiment of the disclosure, a principle for heating by the first light lies in that: the first light emitted by the light source assembly irradiates the first adhesive material and in turn heats the first adhesive material, such that the temperature of the first adhesive material is increased to about 30° C. to 50° C.; at that time, the viscosity of the first adhesive material is decreased so as to facilitate diffusion thereof, thus preventing air bubbles from being produced during the diffusion process of the first adhesive material. In addition, the second light emitted by the light source assembly irradiates the second adhesive material so as to cure the second adhesive material, and the second adhesive material which has been cured may for example resist a temperature below 130° C. As such, since a diffusion temperature of the first adhesive material at which the first adhesive material diffuses as above is far lower than a tolerable temperature of the second adhesive material (i.e., a temperature the second adhesive material may resist) once the second adhesive material has been cured already, then, the diffusion temperature of the first adhesive material may not influence the second adhesive material. It may be seen that, the packaging method according to the embodiment of the disclosure solves the problem of air bubbles caused by insufficient diffusion of the filling adhesive in the relevant packaging technology, and also solves the problem of damage and defects of the adhesive dam due to impact/shock applied thereon by diffusion of the filling adhesive, simultaneously.

It should be noticed that, the first light according to the embodiment of the disclosure may for example be a visible light, and the second light may for example be a UV light; in addition, specific structure and processing ways of the irradiation assembly according to the embodiment of the disclosure, and a positional relationship between the irradiation assembly and the package piece are depicted in detail in above embodiments and thus may not be repeated herein again.

In the packaging method according to the embodiment of the disclosure, the package piece is placed at a corresponding position above the irradiation assembly, and then the first adhesive material within the first region of the package piece is heated by using the first light emitted by the light source assembly in above irradiation assembly (e.g., the first light-emitting region of the light source assembly, which is for example arranged opposite to the first region of the package piece where the first adhesive material is located, and is for example further aligned with each other) to irradiate the first adhesive material within the first region of the package piece, and the second adhesive material is cured by using the second light emitted by the light source assembly in above irradiation assembly (e.g., the second light-emitting region of the light source assembly, which is for example arranged opposite to the second region of the package piece where the second adhesive material is located, and is for example further aligned with each other) to irradiate the second adhesive material within the second region of the package piece; this is done on the basis of above structural features and heating principles of the irradiation assembly, as well as the structural features of the package piece. In the packaging method according to the embodiment of the disclosure, by designing light-emitting types of the light source assembly reasonably, i.e., the first light is used to heat the first adhesive material, and the second light is used to cure the second adhesive material, it solves the problem of air bubbles caused by insufficient diffusion of the filling adhesive in the relevant packaging technology, and also solves the problem of damage and defects of the adhesive dam due to impact/shock applied thereon by diffusion of the filling adhesive, simultaneously.

It has been described in above embodiments of the disclosure that, the light source assembly comprises: light sources in both the first light-emitting region configured to emit the first light and the second light-emitting region configured to emit the second light; and the irradiation assembly further comprises a light source controller, which is connected with the light sources in both the first light-emitting region and the second light-emitting region as above, respectively and for example controls portions of the light source assembly in the first light-emitting region and in the second light-emitting region to switch between respective on and off states respectively. Based on the structural features, step S120 may be implemented for example by different ways as follows.

In an implementation of the disclosure, as illustrated in FIG. 9, a way for implementing the step S120 of the packaging method may for example comprise:

controlling respective portions of the light source assembly in the first light-emitting region and in the second light-emitting region to emit the first light and the second light, by the control of the light source controller, so as to heat the first adhesive material within the first region of the package piece with the first light and to cure the second adhesive material within the second region of the package piece with the second light.

In the implementation, a curing time of the second adhesive material is defined as a first time and a temperature rising time of the first adhesive material from an original temperature to the diffusion temperature thereof is defined as a second time, the first time being smaller or equal to the second time.

Figure 10A:
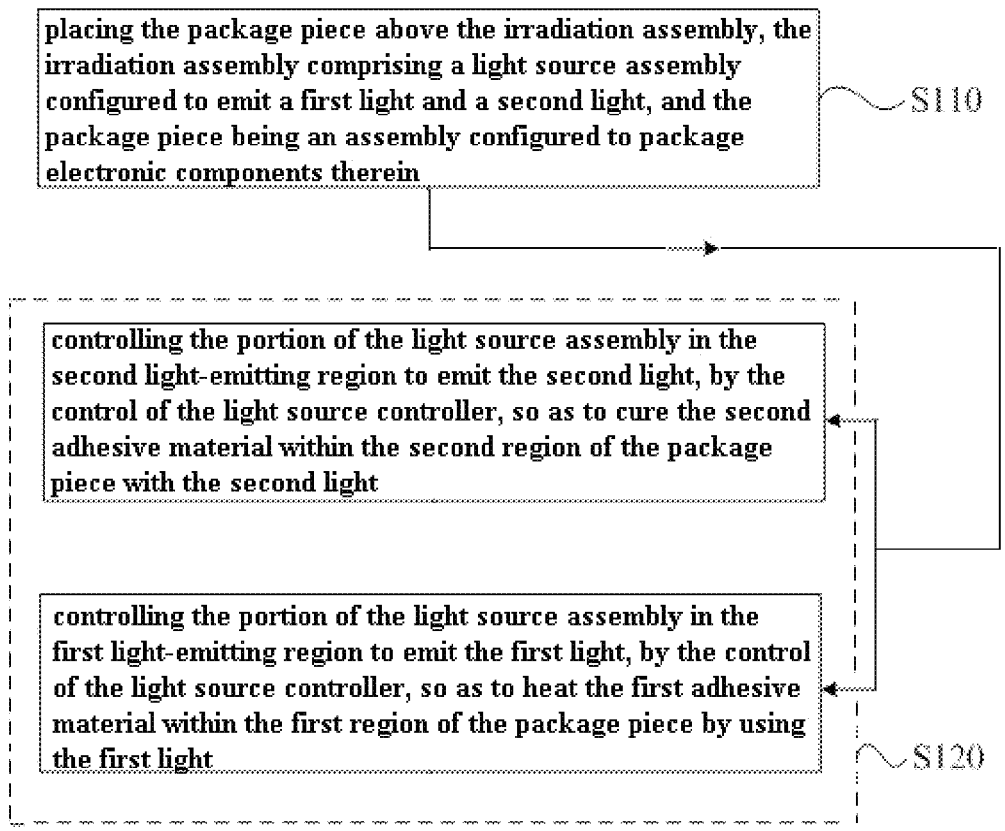
FIG. 10(*a*) illustrates a flow chart of an exemplary packaging method according to the embodiment illustrated in FIG. 9.

In a more specific exemplary embodiment, for example as illustrated in FIG. 10(a), the step of 'controlling respective portions of the light source assembly in the first light-emitting region and in the second light-emitting region to emit the first light and the second light, by the control of the light source controller, so as to heat the first adhesive material within the first region of the package piece with the first light and to cure the second adhesive material within the second region of the package piece with the second light' comprises: controlling respective portions of the light source assembly in the first light-emitting region and in the second light-emitting region to emit the first light and the second light simultaneously, by the control of the light source controller, so as to heat the first adhesive material within the first region of the package piece with the first light and to cure the second adhesive material within the second region of the package piece with the second light concurrently.

In an embodiment of the disclosure, it is illustrated also by taking a condition that the first light is a visible light and the second light is a UV light as an example, and the second adhesive material is for example formed by a UV light curing adhesive, and in a condition of a recommended curing intensity, the UV light curing adhesive has its curing time period being typically the first time T1 which is equal to about 2 min to 5 min (i.e., T1=2~5 min), and the temperature 'A' (i.e., the diffusion temperature thereof) at which the viscosity of the first adhesive material may be decreased to enable a sufficient diffusion thereof ranges between about 30° C. and 50° C. (i.e., A=30° C.~50° C.), and a curing temperature of the first adhesive material is about 80° C.~120° C.; during a process of heating the first adhesive material, a time period which is required to gradually increase the temperature of the first adhesive material from the original temperature C thereof to the diffusion temperature A thereof is the second time T2. Before the first adhesive material is heated to reach the diffusion temperature A, since it has a relatively large viscosity and thus has a relatively poor flowability or fluidity and thus may not impact the second adhesive material. In addition, since the first time T1 is smaller or equal to the second time T2, in other words, before the first adhesive material is heated to reach the diffusion temperature A, the curing of the second adhesive material has been completed already, then, once the first adhesive material diffuses sufficiently at the diffusion temperature A, the second adhesive material which has been cured already is sufficient to exert a blocking effect on the first adhesive material being diffusing, thus resisting the impact applied thereby, without being damaged.

Figure 10B:
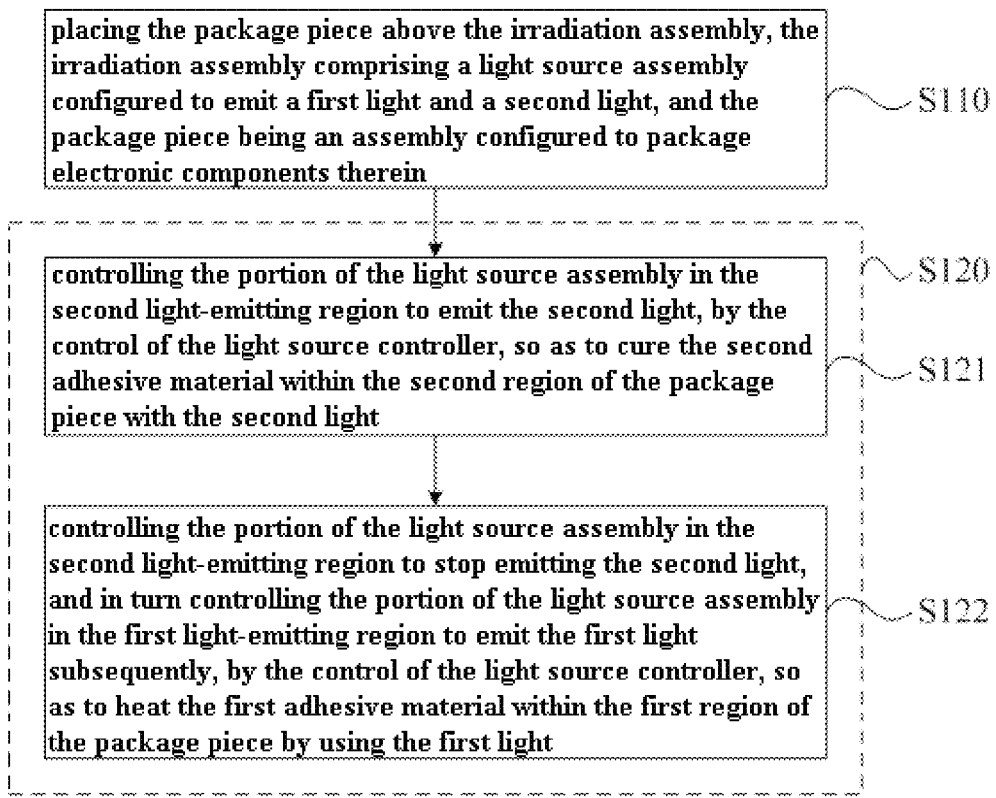

FIG. 10(b) illustrates a flow chart of a packaging method according to another embodiment of the disclosure. On the basis of the embodiment illustrated in FIG. 9, in the packaging method according to the embodiment as illustrated in FIG. 10(b), a way for implementing the step S120 of the packaging method may for example comprise:

S121, controlling the portion of the light source assembly in the second light-emitting region to emit the second light, by the control of the light source controller, so as to cure the second adhesive material within the second region of the package piece with the second light; and S122, controlling the portion of the light source assembly in the second light-emitting region to stop emitting the second light, and in turn controlling the portion of the light source assembly in the first light-emitting region to emit the first light subsequently, by the control of the light source controller, so as to heat the first adhesive material within the first region of the package piece by using the first light.

In the implementation, it is illustrated also by taking a condition that the first light is a visible light and the second light is a UV light as an example, and the second adhesive material is for example formed by a UV light curing adhesive. In the packaging method according to the embodiment as illustrated in FIG. 10(b), by using the light source controller to control a specific way of controlling the portion of the light source assembly in the second light-emitting region to emit UV light firstly in the first time to cure the second adhesive material, the hardness of the second adhesive material may reach a level of efficiently blocking the first adhesive material being diffusing; and once the curing of the second adhesive material is completed, the portion of the light source assembly in the second light-emitting region is then controlled to stop emitting UV light and the portion of the light source assembly in the first light-emitting region is controlled to emit visible light to heat the first adhesive material. In other words, a way of sequential irradiation of the second light and the first light in different times is adopted; and as compared with simultaneous heating and curing processes, the packaging method according to the embodiment as illustrated in FIG. 10(b) has a higher level of controllability, e.g., once it is detected that the second adhesive material is cured completely, the emission of the second light is stopped, and then the first light is emitted to heat the first adhesive material, so as to effectively ensure that the second adhesive material may not be damaged.

After the step S110, the packaging method according to any one of embodiments of the disclosure may for example further comprise:

aligning the package piece and the irradiation assembly with each other to locate the first light-emitting region configured to emit the first light at an orthographic projection position of the first region of the package piece on a plane where the light source assembly is located, and to locate the second light-emitting region configured to emit the second light at an orthographic projection position of the second region of the package piece on a plane where the light source assembly is located (for example an area coverage of the second light-emitting region within the light source assembly at least comprises the orthographic projection of the second region on the plane where the light source assembly is located).

Based on the effects of the first light and the second light of the irradiation assembly, and structural features that the first adhesive material being located in the first region and the second adhesive material being located in the second region of the package piece, the package piece and the irradiation assembly are aligned with each other, e.g., an area coverage of the first light-emitting region within the light source assembly at least comprises the orthographic projection of the first region on the plane where the light source assembly is located, and an area coverage of the second light-emitting region within the light source assembly at least comprises the orthographic projection of the second region on the plane where the light source assembly is located, such that after the aligning, such that the first light emitted by the light source assembly may just irradiate the first region, and the second light emitted by the light source assembly may just irradiate the second region.

Furthermore, the packaging method according to the embodiment may for example further comprise:

Curing the first adhesive material after the first adhesive material in the package piece completes its diffusion upon being heated.

In the embodiment of the disclosure, once the curing of the second adhesive material and the diffusion of the first adhesive material upon heating are both completed, the first adhesive material after diffusion may continue to be processed by curing, and the first adhesive material after curing may be more beneficial to protect the electronic components in the package piece; and based on the packaging requirements of the electronic components, then in a finished product after the package, the package piece should be in a form of solid state.

It should be noticed that, a way for curing the first adhesive material according to the embodiment of the disclosure for example comprises UV curing and curing by heating. In the way for curing the first adhesive material by heating, it is already depicted in above embodiment that the curing temperature of the first adhesive material is about 80° C.~120° C., lower than the tolerable temperature of the second adhesive material (i.e., the temperature the second adhesive material may resist) once the second adhesive material has been cured already, i.e., about 130° C. Therefore, the curing temperature of the first adhesive material may not influence the performance of the second adhesive material.

Although the embodiments disclosed in the present disclosure are as described above, they are merely provided to facilitate the understanding of the present disclosure, and are not intended to limit the present disclosure. Any modifications and variations may be made by those skilled in the art in terms of form and detail without departing from the spirit and scope of the present disclosure, but the scope of the present disclosure is defined by the appended claims.

What is claimed is:

1. An irradiation assembly, configured to heat and cure a package piece which is aligned with the irradiation assembly and has a first region and a second region, the first region being provided with a first adhesive material therein and the second region being provided with a second adhesive material therein, the second adhesive material being different from the first adhesive material, the irradiation assembly comprising:
a light source assembly, which is configured to emit a first light heating the first adhesive material within the first region of the package piece and to emit a second light curing the second adhesive material within the second region of the package piece; and
supporting columns, which are provided on a side of the light source assembly facing towards the package piece and configured to support the package piece,
wherein the package piece is an assembly configured to encapsulate electronic components accommodated therein, the first region of the package piece is provided with the electronic components and is filled up with the first adhesive material encapsulating the electronic components, and the second region of the package piece is arranged at a periphery of the first region and is filled with the second adhesive material surrounding the first adhesive material.

2. The irradiation assembly according to claim 1, wherein the light source assembly comprises:

a first light-emitting region, which is configured to emit the first light and is arranged corresponding to the first region of the package piece; and
a second light-emitting region, which is configured to emit the second light and is arranged corresponding to the second region of the package piece.

3. The irradiation assembly according to claim 2, wherein the light source assembly further comprises:
a first light source provided in the first light-emitting region and the second light-emitting region respectively and configured to emit the first light; and
a light conversion layer provided on a portion of the first light source being located within the second light-emitting region at a side of the first light source facing the package piece, and configured to convert a portion of the first light emitted by the portion of the first light source being located within the second light-emitting region into the second light.

4. The irradiation assembly according to claim 3, wherein the light conversion layer is formed by transparent resin doped with an upconversion material.

5. The irradiation assembly according to claim 4, wherein the first light source is a visible light source, and the first light is visible light and the second light is ultraviolet light; and
wherein the upconversion material is a visible-ultraviolet upconversion material.

6. The irradiation assembly according to claim 2, wherein the light source assembly comprises:
a first light source provided in the first light-emitting region and configured to emit the first light; and
a second light source provided in the second light-emitting region and configured to emit the second light,
wherein the first light source and the second light source are disposed to be independent of each other.

7. The irradiation assembly according to claim 6, wherein the first light source is a visible light source and the second light source is a ultraviolet light source, and the first light is visible light and the second light is ultraviolet light.

8. The irradiation assembly according to claim 2, further comprising: a light source controller, which is connected with the light source assembly, and configured to control portions of the light source assembly in the first light-emitting region and in the second light-emitting region to switch between respective on and off states respectively, so as to emit either one or both of the first light and the second light.

9. The irradiation assembly according to claim 1, further comprising: a diffusion layer covering the light source assembly, or a transparent cover plate covering the light source assembly.

10. The irradiation assembly according to claim 1, further comprising: a diffusion layer covering the light source assembly, and a transparent cover plate covering the diffusion layer.

11. A packaging device, comprising:
the irradiation assembly according to claim 1, and
the package piece, comprising:
a first cover plate and a second cover plate aligned and assembled with each other; and
the first adhesive material and the second adhesive material configured to encapsulate the electronic components between the first cover plate and the second cover plate,
wherein the first adhesive material within the first region and the electronic components are encapsulated within a closed space which is delimited and defined collectively by the first cover plate, the second cover plate, and the second adhesive material within the second region.

12. The packaging device according to claim 11, wherein the light source assembly comprises:
   a first light-emitting region, which is configured to emit the first light and is arranged corresponding to the first region of the package piece; and
   a second light-emitting region, which is configured to emit the second light and is arranged corresponding to the second region of the package piece,
   wherein the first light-emitting region configured to emit the first light is located at an orthographic projection position of the first region on a plane where the light source assembly is located, and the second light-emitting region configured to emit the second light is located at an orthographic projection position of the second region on the plane where the light source assembly is located.

13. A packaging method using the packaging device according to claim 11, the packaging method comprising:
   placing the package piece above the irradiation assembly and aligning the package piece with the irradiation assembly; and
   heating the first adhesive material within the first region of the package piece by using the first light emitted by a first light-emitting region of the light source assembly, and curing the second adhesive material within the second region of the package piece by using the second light emitted by a second light-emitting region of the light source assembly.

14. The packaging method according to claim 13, wherein the irradiation assembly further comprises a light source controller which is connected with the light source assembly; and
   wherein heating the first adhesive material within the first region of the package piece by using the first light emitted by the light source assembly, and curing the second adhesive material within the second region of the package piece by using the second light emitted by the light source assembly comprises:
   controlling respective portions of the light source assembly in the first light-emitting region and in the second light-emitting region to emit the first light and the second light, respectively by the control of the light source controller, so as to heat the first adhesive material within the first region of the package piece with the first light and to cure the second adhesive material within the second region of the package piece with the second light.

15. The packaging method according to claim 14, wherein a curing time of the second adhesive material is defined as a first time and a temperature rising time of the first adhesive material from an original temperature to a diffusion temperature thereof is defined as a second time, the first time being smaller or equal to the second time.

16. The packaging method according to claim 14, wherein after placing the package piece above the irradiation assembly, the packaging method further comprises:
   aligning the package piece and the irradiation assembly with each other to locate the first light-emitting region configured to emit the first light at an orthographic projection position of the first region of the package piece on a plane where the light source assembly is located, and to locate the second light-emitting region configured to emit the second light at an orthographic projection position of the second region of the package piece on a plane where the light source assembly is located.

17. The packaging method according to claim 14, further comprising:
   curing the first adhesive material after the first adhesive material in the package piece completes its diffusion upon being heated.

18. The packaging method according to claim 14, wherein the step of controlling respective portions of the light source assembly in the first light-emitting region and in the second light-emitting region to emit the first light and the second light, respectively by the control of the light source controller, so as to heat the first adhesive material within the first region of the package piece with the first light and to cure the second adhesive material within the second region of the package piece with the second light comprises:
   controlling respective portions of the light source assembly in the first light-emitting region and in the second light-emitting region to emit the first light and the second light simultaneously, by the control of the light source controller, so as to heat the first adhesive material within the first region of the package piece with the first light and to cure the second adhesive material within the second region of the package piece with the second light concurrently.

19. The packaging method according to claim 13, wherein heating the first adhesive material within the first region of the package piece by using the first light emitted by the light source assembly, and curing the second adhesive material within the second region of the package piece by using the second light emitted by the light source assembly comprises:
   controlling the portion of the light source assembly in the second light-emitting region to emit the second light, by the control of the light source controller, so as to cure the second adhesive material within the second region of the package piece with the second light; and
   controlling the portion of the light source assembly in the second light-emitting region to stop emitting the second light, and in turn controlling the portion of the light source assembly in the first light-emitting region to emit the first light subsequently, by the control of the light source controller, so as to heat the first adhesive material within the first region of the package piece by using the first light.

* * * * *